US010254816B2

(12) United States Patent
Yuasa et al.

(10) Patent No.: US 10,254,816 B2
(45) Date of Patent: Apr. 9, 2019

(54) SUBSTRATE PROCESSING APPARATUS, EDITING APPARATUS AND METHOD AND NON-TRANSITORY STORAGE MEDIUM

(71) Applicant: TOKYO ELECTRON LIMITED, Tokyo (JP)

(72) Inventors: Seiichiro Yuasa, Koshi (JP); Kunihiko Fujimoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 147 days.

(21) Appl. No.: 14/609,901

(22) Filed: Jan. 30, 2015

(65) Prior Publication Data

US 2015/0220136 A1 Aug. 6, 2015

(30) Foreign Application Priority Data

Jan. 31, 2014 (JP) .................................. 2014-017713

(51) Int. Cl.
 *G06F 1/32* (2006.01)
 *G06F 1/3234* (2019.01)
 (Continued)

(52) U.S. Cl.
 CPC ....... *G06F 1/3265* (2013.01); *G05B 19/0426* (2013.01); *G06F 1/3287* (2013.01);
 (Continued)

(58) Field of Classification Search
 CPC .. G06F 1/3265; G06F 1/3287; G05B 19/0426
 (Continued)

(56) References Cited

U.S. PATENT DOCUMENTS 7,228,257 B1 *  6/2007  Patrick ................. G05B 19/418
                                                      382/144
7,409,253 B2    8/2008  Shimizu et al.
                        (Continued)

FOREIGN PATENT DOCUMENTS

CN    101124580 A    2/2008
JP    H06-333834 A   12/1994
                     (Continued)

OTHER PUBLICATIONS

Wang, et al. "A graphical programming and design environment for FPGA-based hardware." Field-Programmable Technology (FPT), 2010 International Conference on. IEEE, 2010. pp. 337-340. (retreived from http://ieeexplore.ieee.org/stamp/stamp.jsp?arnumber=5681433 &tag=1 Jan. 27, 2017).*

(Continued)

*Primary Examiner* — Mohammad Ali
*Assistant Examiner* — Joshua T Sanders
(74) *Attorney, Agent, or Firm* — Burr & Brown, PLLC

(57) ABSTRACT

A control unit of a substrate processing apparatus has a storage medium that stores operation commands as a single macro. The operation commands include an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance. The control unit makes a display unit display both the operation commands for shutdown and startup together on a single ejection screen of the display unit, and allows editing of the macro on the single edit screen by using the input unit.

25 Claims, 10 Drawing Sheets

(51) Int. Cl.
*G06F 1/3287* (2019.01)
*G05B 19/042* (2006.01)
*H01L 21/67* (2006.01)

(52) U.S. Cl.
CPC .............. *G05B 2219/24001* (2013.01); *G05B 2219/25389* (2013.01); *H01L 21/67276* (2013.01)

(58) Field of Classification Search
USPC ....................................................... 700/108
See application file for complete search history.

(56) References Cited

U.S. PATENT DOCUMENTS

| | | | | |
|---|---|---|---|---|
| 2001/0029888 | A1* | 10/2001 | Sundarrajan | C23C 14/564 |
| | | | | 118/715 |
| 2006/0160256 | A1 | 7/2006 | Obi et al. | |
| 2007/0233629 | A1* | 10/2007 | Balog | G01R 31/31831 |
| | | | | 706/47 |
| 2014/0302687 | A1* | 10/2014 | Ashihara | C23C 16/4485 |
| | | | | 438/780 |

FOREIGN PATENT DOCUMENTS

| | | | | |
|---|---|---|---|---|
| JP | 3116658 | B2 | 12/2000 | |
| JP | 2004-336024 | A | 11/2004 | |
| JP | 2006-202912 | A | 8/2006 | |
| JP | 2007-505508 | A | 3/2007 | |
| JP | 4781505 | B2 | 9/2011 | |
| JP | WO 2013094680 | A1 * | 6/2013 | ......... C23C 16/4485 |
| TW | 200746338 | | 12/2007 | |
| WO | 2005/001893 | A2 | 1/2005 | |

OTHER PUBLICATIONS

Japanese Office Action, Japanese Application No. 2014-017713, dated Sep. 16, 2016 (3 pages).
Taiwanese Office Action (Application No. 104102096) dated Oct. 21, 2016.
Chinese Office Action (Application No. 201510051937.6) dated Jan. 2, 2018 (with English translation).

* cited by examiner

SUBSTRATE PROCESSING APPARATUS, EDITING APPARATUS AND METHOD AND NON-TRANSITORY STORAGE MEDIUM

CROSS REFERENCE TO RELATED APPLICATION

This application is based upon and claims the benefit of priority from Japanese patent application No. 2014-017713 filed on Jan. 31, 2014, the entire contents of which are incorporated herein by reference.

FIELD OF THE INVENTION

The present invention relates to a technique for automating steps required for shutdown and startup of a substrate processing apparatus for processing substrates, such as semiconductor wafers, before and after performing man power maintenance to the substrate processing apparatus.

BACKGROUND ART

In the substrate processing apparatus for processing substrates such as semiconductor wafers, man power maintenance, such as chamber cleaning, exchange of consumable components and so on, is periodically carried out for maintaining a stable processing function. Prior to the man power maintenance, the substrate processing apparatus is entirely or partly transferred to a condition suitable for the man power maintenance (shutdown of the substrate processing apparatus). Specifically, before performing the man power maintenance, the substrate processing apparatus automatically performs steps, such as a step by which the temperature in a processing module (module) for a high temperature process is lowered to a temperature that does not interfere with the man power maintenance, and steps (e.g., cleaning of a processing liquid supply system) other than steps that can be performed only by man power (hand work), out of a number of maintenance steps, for example.

Japanese Patent JP3116658B2 describes that a group of operation commands for performing a series of steps required for transferring a substrate processing apparatus to a condition suitable for man power maintenance are prepared as a macro, and that the series of steps are automatically performed only by inputting an execution command of the macro by an operator through a keyboard of a control computer.

In order to transfer the substrate processing apparatus to a normally-operating condition after completion of the man power maintenance, it is necessary to transfer the substrate processing apparatus to a condition suitable for executing a normal processing recipe. For example, in a processing liquid line in which components have been exchanged, the processing liquid line has to be cleaned. A step for startup the substrate processing apparatus is not included in a general processing recipe prepared for product substrates. JP3116658B2 does not describe that the substrate processing apparatus automatically performs a procedure for the startup of the substrate processing apparatus. Thus, the technique of JP3116658B2 leaves room for improvement to automate procedures to be performed before and after the man power maintenance.

In addition, in JP3116658B2, the previously prepared macro is used, and edition of the macro by a user is not described. Even if a user can edit the macro, JP3116658B2 does not describe at all a user interface for editing the macro.

Thus, it is difficult for the technique of JP3116658B2 to flexibly cope with various maintenance modes.

Japanese patent JP4781505B2 describes that a preset inspection is automatically performed after maintenance and before a normal operation. However, JP4781505B2 does not describe a procedure for the shutdown to be performed before the maintenance, and thus there is room for improvement to automate procedures to be performed before and after the man power maintenance.

SUMMARY OF THE INVENTION

The present invention provides a technique by which procedures to be performed before and after man power maintenance, which are required for shutdown of a substrate processing apparatus and for startup of the same, can be easily and reliably set by a user.

In one embodiment of the present invention, there is provided a substrate processing apparatus which includes: a control unit having a non-transitory storage medium that stores operation commands as a single macro, the commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, wherein the control unit controls the substrate processing apparatus according to the macro; an input unit that allows inputting of the operation commands into the control unit; and a display unit that displays information related to the operation commands inputted into the control unit; wherein the control unit makes the display unit display both the operation command for shutdown and the operation command for startup together on a single edit screen of the display unit, and allows editing of the macro on the single edit screen by using the input unit.

In another embodiment of the present invention, there is provided a non-transitory storage medium storing a program executable by a computer serving as a control unit of a substrate processing apparatus, wherein the substrate processing apparatus includes: the control unit having a non-transitory storage medium that stores operation commands as a single macro, the operation commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, wherein the control unit controls the substrate processing apparatus according to the macro; an input unit that allows inputting of the operation commands into the control unit; and a display unit that displays information related to the operation commands inputted into the control unit, wherein the storage medium stores a program, upon execution of which a function of editing and displaying a maintenance recipe is realized via the computer, wherein the function includes a function to make the display unit display the operation command for shutdown and the operation command for startup on a single ejection screen of the display unit, and to allow editing of the macro on the single edit screen by using the input unit.

In yet another embodiment, there is provided an editing apparatus for editing operation commands for use in a substrate processing apparatus having a non-transitory storage medium that stores operation commands as a single macro, the operation commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, the editing apparatus including: a display unit that displays the operation command for shutdown and the operation command for startup on a single edit screen; an editing unit that allows the single macro including both the operation command for shutdown and the operation command for startup to be edited on the single screen in accordance with inputs by the input unit; and a transmission unit that transmits the single macro having been edited by the editing unit to the substrate processing apparatus.

In still yet another embodiment, there is provided an editing method of editing operation commands for use in a substrate processing apparatus having a non-transitory storage medium that stores operation commands as a single macro, the commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance. The editing method includes: displaying both the operation command for shutdown and the operation command for startup together on a single edit screen; allowing the single macro including both the operation command for shutdown and the operation command for startup to be edited on the single screen in accordance with an input by the input unit; and transmitting the single macro having been edited by the editing unit to the substrate processing apparatus.

In a further embodiment, there is provided a non-transitory storage medium storing a program for performing an editing method for editing an operation command for use in a substrate processing apparatus having a non-transitory storage medium that stores operation commands as a single macro, the operation commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, wherein the editing method includes: displaying both the operation command for shutdown and the operation command for startup together on a single edit screen; allowing the single macro including both the operation command for shutdown and the operation command for startup to be edited on the single screen in accordance with an input by the input unit; and transmitting the single macro having been edited by the editing unit to the substrate processing apparatus.

According to the foregoing embodiments, since the macro including the shutdown operation command and the startup operation command can be edited on the single edit screen, procedures required for the shutdown and the startup can be easily and reliably set by a user.

DESCRIPTION OF EMBODIMENTS

An embodiment of the present invention will be described with reference to the drawings. Hereinafter, an explanation is made for a plating system as an example of a substrate processing apparatus (substrate processing system). A plating system 10 is configured to perform a plating process to a substrate (silicon substrate) 2 having a recess 2a (see FIG. 2), such as a semiconductor wafer.

Figure 1:
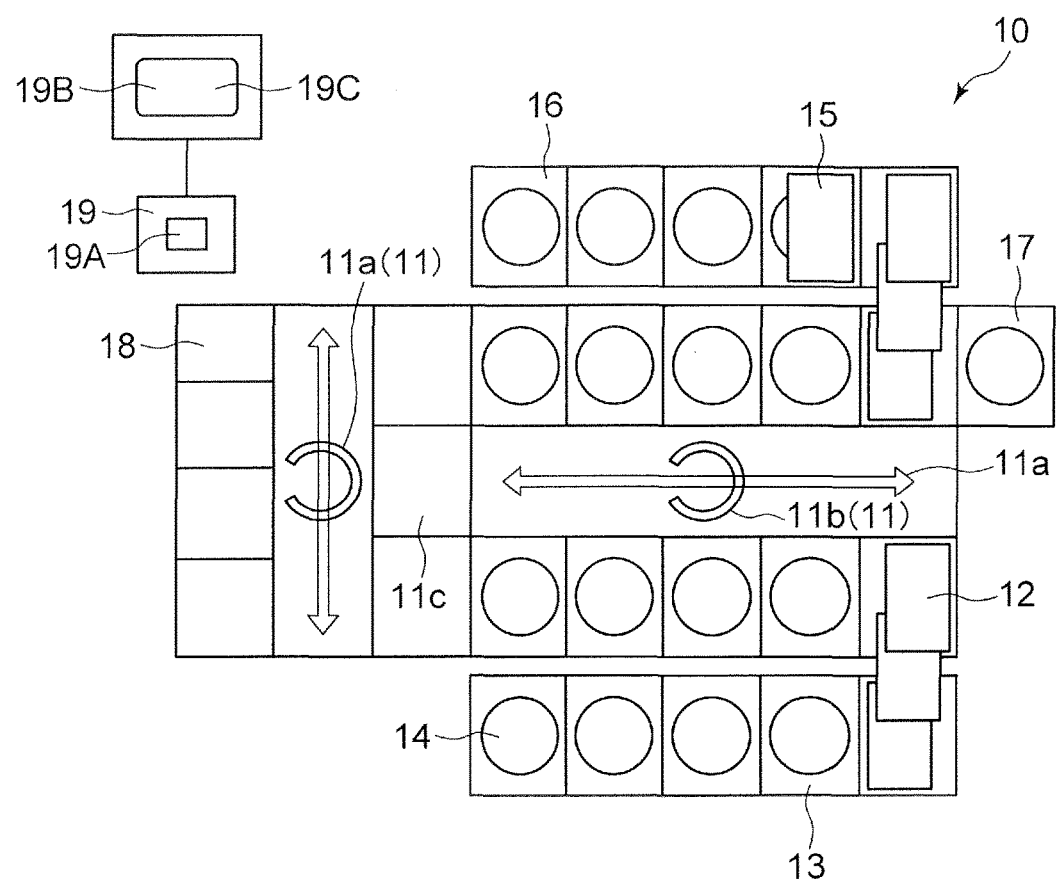
FIG. 1 is a plan view schematically showing an overall structure of a plating system in one embodiment of a substrate processing apparatus.

As shown in FIG. 1, the plating system 10 includes a cassette station 18 on which a cassette (not shown) containing the substrate 2 is placed. A substrate transport mechanism 11 removes the substrate 2 from the cassette on the cassette station 18, and transports the substrate 2 to respective processing modules 12 to 17 described below. The substrate transport mechanism 11 is provided with a first transport arm 11a and a second transport arm 11b. The first transport arm 11a, which moves in the vicinity of the cassette station 18, takes out the substrate 2 from the cassette and delivers the substrate 2 to a substrate buffer 11c. The second transport arm 11b loads the substrate 2 from the substrate buffer 11c into a coupling module 12, and also transports the substrate among the respective processing modules 12 to 17. The substrate, which has been subjected to a series of processes, is returned to the substrate buffer 11c by the second transport arm 11b, and is further returned to the same position in the cassette by the first transport arm 11a.

The coupling module 12, a catalyst layer forming module 13, and an electroless plating module 14 are arranged on one side of a track 11d of the second transport arm 11b. A baking module 15 and an electroless plating module 16 are arranged on the other side of the track 11d. An electrolytic plating module 17 is arranged adjacently to the baking module 15.

The respective constituent members of the aforementioned plating system, such as the cassette station 18, the substrate transport mechanism 11, the coupling module 12, the catalyst layer forming module 13, the electroless plating module 14, the baking module 15, the electroless plating module 16 and the electrolytic plating module 17, are driven and controlled by a control unit 19 in accordance with various programs stored in a storage medium 19A provided on the control unit 19, whereby the substrate 2 is subjected to various processes. The storage medium 19A stores various setting data and various programs such as the below-described plating program and the like. A known device may be used as the storage medium 19A. For example, a computer-readable memory, such as a ROM or a RAM, or a disk-shaped storage medium such as a hard disc, a CD-ROM, a DVD-ROM or a flexible disc may be used as the storage medium 19A.

A display (display unit) 19B and an input unit 19C are connected to the control unit 19. The display 19B and the input unit 19C may be integrated to each other to provide a touch panel display, or a combination of a display not having a touch panel function, and an input unit such as a keyboard, a mouse, a touch pad or the like. Hereinafter, the explanation is made on the assumption that the display 19B and the input unit 19C are integrated to each other to provide a touch panel display, and all the input operation can be performed by touching a screen, for simplification of explanation.

Figure 3:
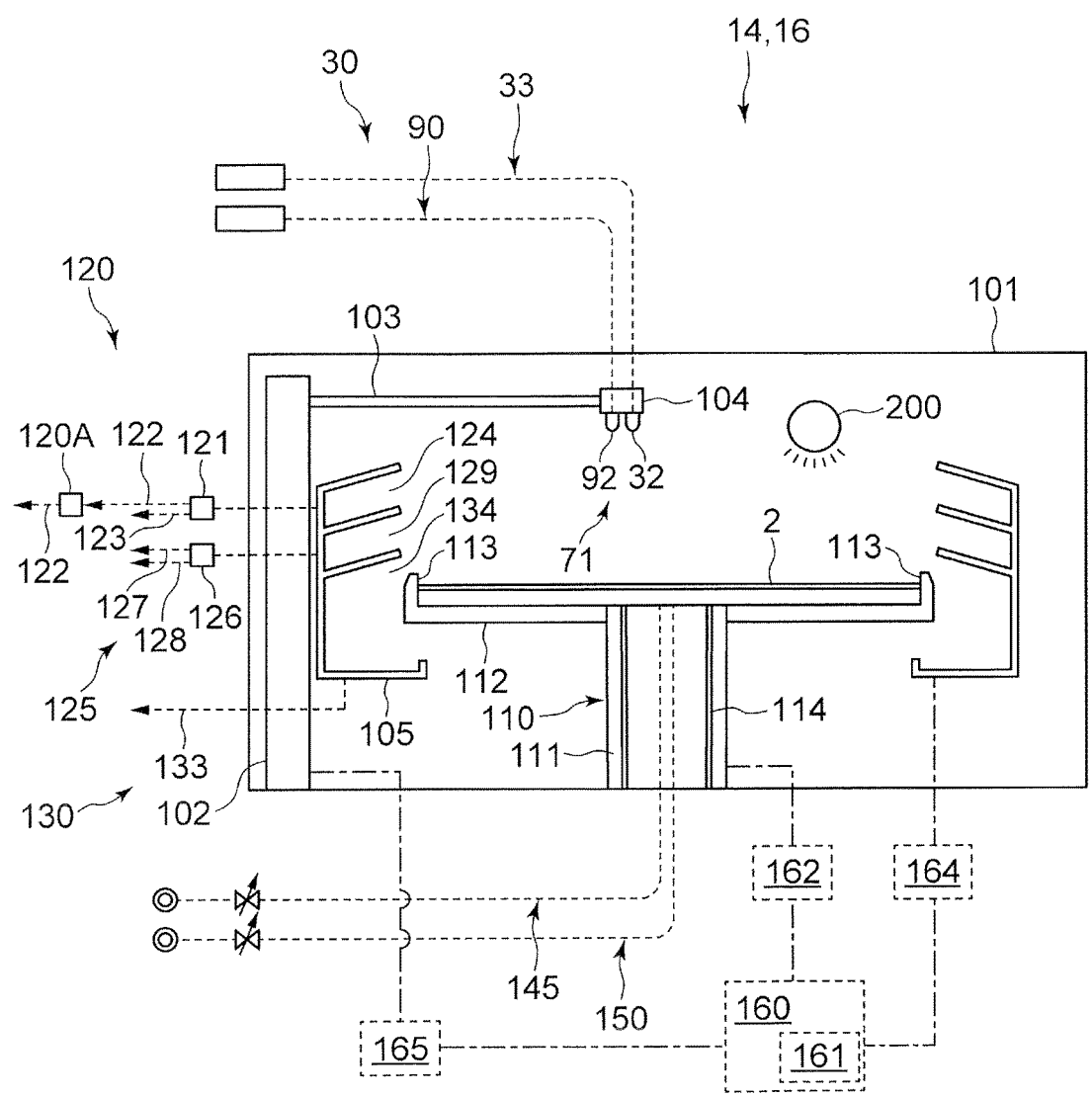
FIG. 3 is a vertical sectional view schematically showing the structure of a plating module.
Figure 5:
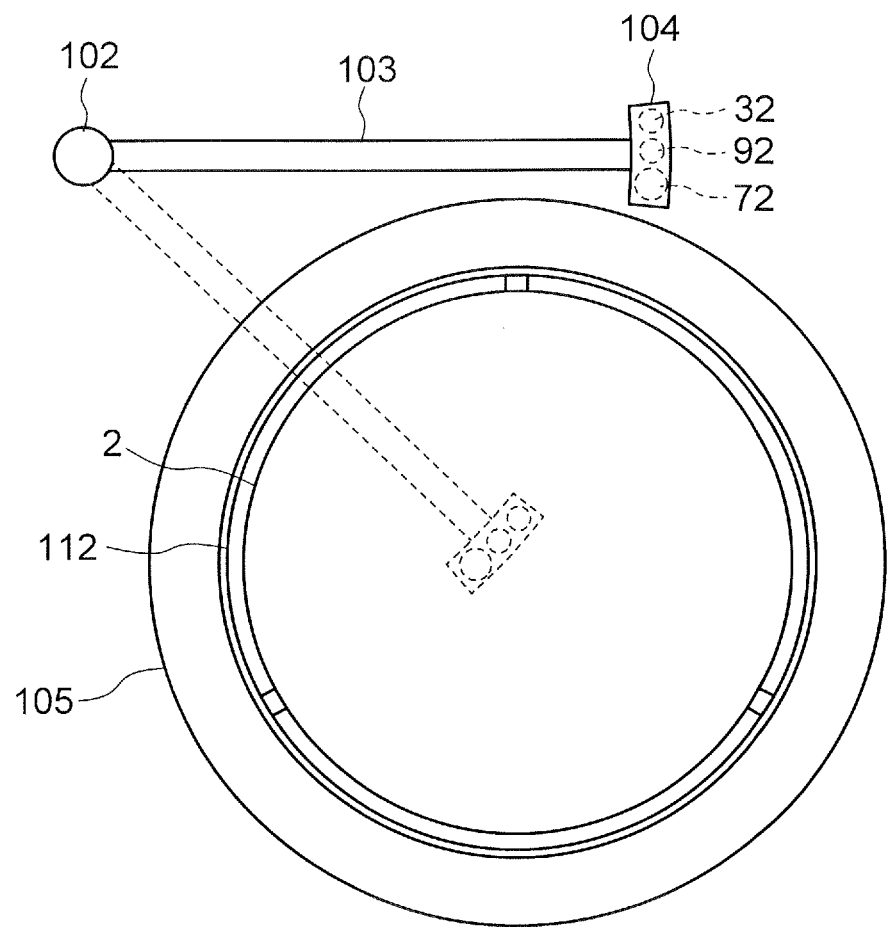
FIG. 5 is a plan view schematically showing the structure of the plating module.

Each of the electroless plating modules 14 and 16 has a structure shown in FIGS. 3 and 5. Each of the electroless plating modules 14 and 16 includes: a substrate rotating and holding mechanism (substrate housing unit) 110 for rotating and holding the substrate 2 inside a casing 101; liquid supply mechanisms 30 and 90 for supplying a plating liquid and a cleaning liquid to a surface of the substrate 2; a cup 105 for receiving the plating liquid and the cleaning liquid scattering from the substrate 2, discharge paths 124, 129 and 134 through which the plating liquid and the cleaning liquid received by the cup 105 are discharged; liquid discharge mechanism 120, 125 and 130 for discharging the liquids collected in the discharge paths; and a control mechanism 160 for controlling the substrate rotating and holding mechanism 110, the liquid supply mechanisms 30 and 90, the cup 105 and the liquid discharge mechanisms 120, 125 and 130.

The substrate rotating and holding mechanism 110 includes: a hollow cylindrical rotating shaft 111 extending in an up and down direction in the casing 101; a turntable 112 attached to an upper end portion of the rotating shaft 111; a substrate chuck 113 disposed on an outer circumferential part of an upper surface of the turntable 112, the substrate chuck 113 being configured to support the substrate 2; and a rotating mechanism 162 for driving the rotating shaft 111 in rotation. The rotating mechanism 162 is controlled by the control unit 160. The rotating shaft 111 is driven in rotation by the rotating mechanism 162, so that the substrate 2 supported by the substrate chuck 113 is rotated.

The liquid supply mechanisms 30 and 90 include a plating liquid supply mechanism 30 configured to supply a plating liquid for plating to the surface of the substrate 2, and a cleaning liquid supply mechanism 90 configured to supply a cleaning liquid to the surface of the substrate 2.

The plating liquid supply mechanism 30 includes an ejection nozzle 32 attached to a nozzle head 104. The nozzle head 104 is attached to a distal end portion of an arm 103. The arm 103 is driven in rotation by the rotating mechanism 165, and is fixed on a support shaft 102 by a not-shown elevating and driving mechanism. A plating liquid supply pipe 33 of the plating liquid supply mechanism 30 is located inside the arm 103. Due to this structure, the liquid supply mechanism 30 can eject the plating liquid, through the ejection nozzle 32, onto a given location on the surface of the substrate 2, from a desired height position.

The cleaning liquid supply mechanism 90 includes a nozzle 92 attached to the nozzle head 104. Any one of a cleaning liquid formed of a chemical liquid such as DHF or SC1, or a rinse liquid such as DIW (deionized water) can be selectively ejected from the nozzle 92 to the surface of the substrate 2.

Figure 4:
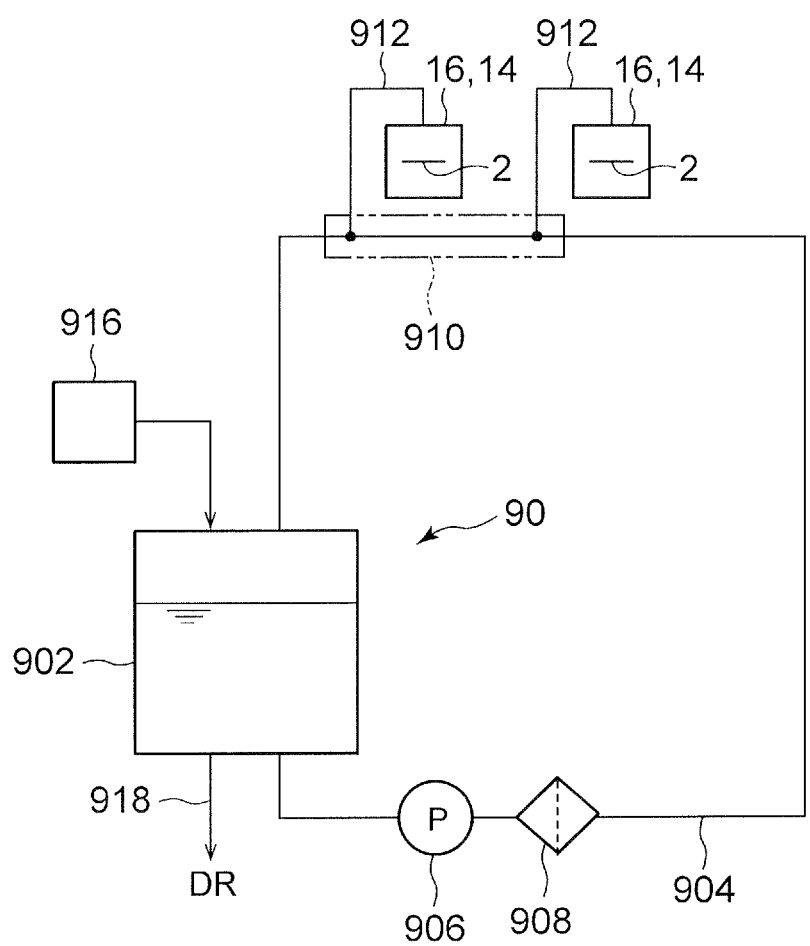
FIG. 4 is a piping diagram showing the structure of a liquid supplying mechanism in one example.

A part of the cleaning liquid supply mechanism 90, which is related to the supply of the cleaning liquid formed of a chemical liquid, is explained with reference to FIG. 4. The cleaning liquid is supplied from the cleaning liquid supply mechanism 90 to the plurality of electroless plating modules 14 and 16. The cleaning liquid supply mechanism 90 includes a tank 902 for storing the cleaning liquid, and a circulation line 904 extending from the tank 902 to return to the tank 902. The circulation line 904 is equipped with a pump 906. The pump 906 forms a circulation flow which goes out from the tank 902 to return to the tank 902 through the circulation line 904. On the downstream side of the pump 906, the circulation line 904 is provided with a filter 908 for removing contaminants such as particles contained in the cleaning liquid.

Figure 2:
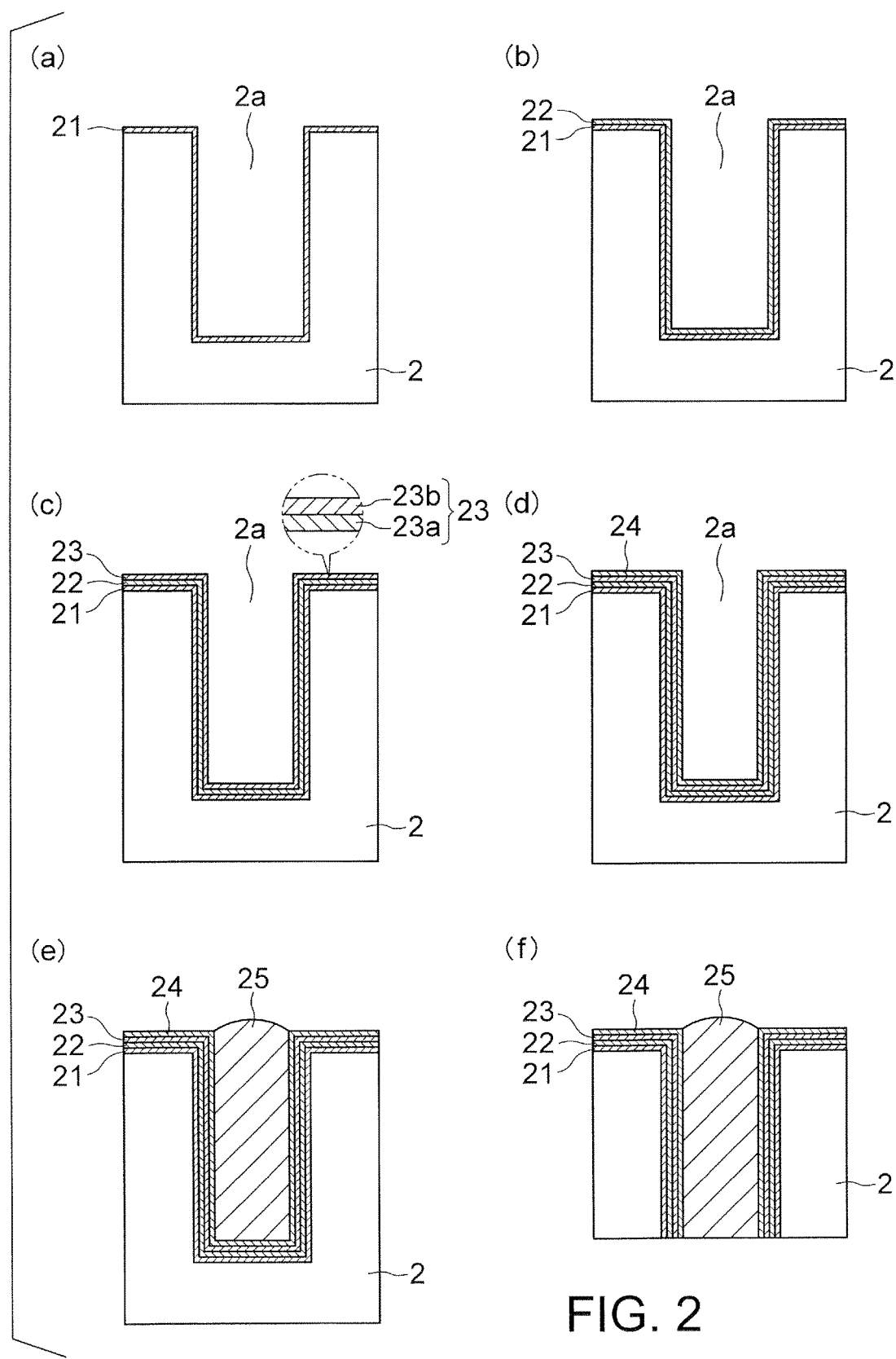
FIG. 2 shows cross-sectional views of a substrate, for explaining a process steps performed by the plating system.

One or more branch lines 912 are connected to a connection area 910 set in the circulation line 904. The respective branch lines 912 are configured to supply the cleaning liquid flowing through the circulation line 904 to the corresponding electroless plating modules 14 and 16. According to need, each branch line 912 may include a flow rate regulating mechanism such as a flow rate control valve, a filter and so on. The nozzle 92 shown in FIG. 2 is disposed on a terminal end of each branch line 912.

The tank 902 includes a tank liquid replenishing unit 916 for replenishing a processing liquid or a constituent of the processing liquid. In addition, the tank 902 includes a drain unit 918 for discharging the processing liquid in the tank 902.

The plating liquid supply mechanism 30 may have the same structure as that of the cleaning liquid supply mechanism 90 (the difference is only the liquid to be used). The structure of the liquid supply mechanism is not limited the structure shown in FIG. 4. Depending on the type of the processing liquid, the circulation line 904 is not provided but a supply line directly connecting the processing liquid source and the processing liquid nozzle is provided, for example.

The cup 105, which is driven in the up and down direction by the elevating mechanism 164, is located in the casing 101. The cup 105 includes the discharge paths 124, 129 and 134, which are schematically shown in FIG. 3. The liquid discharge mechanism 120, 125 and 130 discharge liquids which are collected in the discharge paths 124, 129 and 134 depending on a relative height positional relationship between the cup 105 and the substrate 2.

The plating liquid discharge mechanisms 120 and 125 respectively include collection flow paths 122 and 127 and disposal flow paths 123 and 128 which are switched by flow path switching devices 121 and 126. The collection flow paths 122 and 127 are flow paths by which the plating liquid is collected to be reused. The disposal flow paths 123 and 128 are flow paths by which the plating liquid is discarded. Only a disposal flow path 133 is provided on the processing liquid discharge mechanism 130.

The collection flow path 122 of the plating liquid discharge mechanism 120 for discharging the plating liquid 35 is connected to an outlet side of the substrate housing unit 110. A cooling buffer 120A for cooling the plating liquid 35 is disposed on the collection flow path 122 in the vicinity of the outlet side of the substrate housing unit 110.

Figure 6:
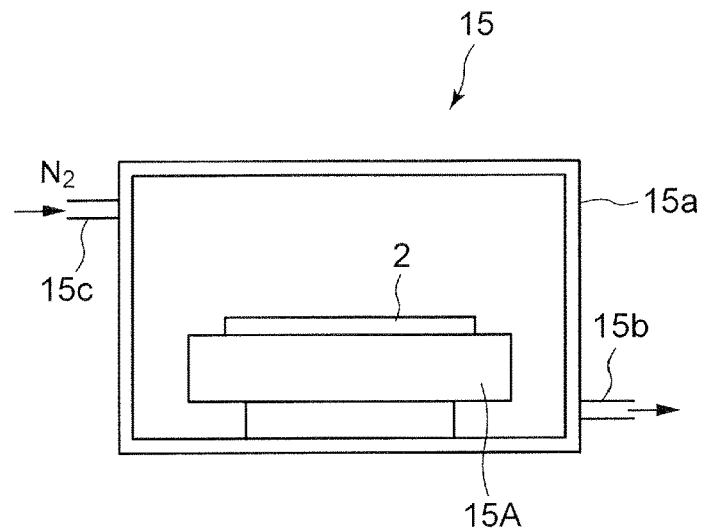
FIG. 6 is a vertical sectional view schematically showing the structure of a baking module.

As shown in FIG. 6, the baking module 15 includes a sealed casing 15a that is sealed, and a hot plate 15A disposed inside the sealed casing 15a. The sealed casing 15a of the baking module 15 has a transport opening (not shown) through which the substrate 2 is transported. $N_2$ gas is supplied into the sealed casing 15a from an $N_2$ gas supply opening 15c. At the same time, by exhausting the sealed casing 15a through an exhaust opening 15b, the sealed casing 15 is filled with the $N_2$ gas. Thus, the inside of the sealed casing 15a can be maintained in an inert gas atmosphere.

Next, the operation of the plating system 10 during a normal operation is briefly described.

In a pre-step, a recess 2a is formed in a substrate (silicon substrate) 2 formed of a semiconductor wafer or the like, by a known dry etching process, for example. The substrate 2 is loaded into the plating system 10.

The loaded substrate is firstly taken out from a cassette on the cassette station 18 by the transport arm 11a of the substrate transport mechanism 11, and is delivered to the substrate buffer 11c.

Then, the substrate 2 is delivered by the transport arm 11b to the coupling module 12 including a vacuum chamber (not shown) with a heating unit. In the coupling module 12, a coupling layer 21 called SAM is formed on the substrate 2 by a known silane coupling forming technique (FIG. 2(a)).

Thereafter, the substrate 2 is delivered by the transport arm 11b to the catalyst-layer forming module 13. In the catalyst-layer forming module 13, a Pd catalyst layer 22 is formed on the coupling layer 21 (FIG. 2(b)) by a known palladium adsorption technique.

After that, the substrate 2 is delivered by the transport arm 11b to the plating module 14. In the plating module 14, a first plating layer 23a functioning as a Cu diffusion prevention film (barrier film) is formed on the catalyst layer 22 (FIG. 2(c)) by a known electroless plating technique, with the use of a plating liquid containing Co—W—B whose temperature is adjusted at about 40 to 75° C. After the first plating layer 23a has been formed, the substrate 2 is cleaned by means of a cleaning liquid and a rinse liquid.

Then, the substrate 2 is delivered by the transport arm 11b from the plating module 14 into the sealed casing 15a of the baking module 15. In the baking module 15, the substrate 2 is subjected to the baking (vitrifying) process. In the baking process, with the inside of the sealed casing 15a being in an inert gas atmosphere, the substrate 2 is placed on the hot plate 15A, and is heated at a temperature of 150 to 200° C. for 10 to 30 minutes, for example. Due to the baking process, moisture in the first plating layer 23a is released outside, and a degree of coupling of metals in the first plating layer 23a is increased.

Then, the substrate 2 is again delivered by the transport arm 11b to the plating module 14. In the plating module 14, a second plating layer 23b as a Cu diffusion prevention film is formed on the first plating layer 23a by an electroless plating process performed by the same condition as that of the electroless plating method for forming the first plating layer 23a.

Then, the substrate 2 is again delivered by the transport arm 11b from the plating module 14 to the baking module 15. Then, in the sealed casing 15a of the baking module 15, the second plating layer 23b is subjected to a baking process under the same condition as that of the previous baking process.

In this manner, a plating-layer laminate 23, which is composed of the first plating layer 23a and the second plating layer 23b to serve as the Cu diffusion prevention film (barrier film), is formed on the substrate 2.

Then, the substrate 2 is delivered by the transport arm 11b to the electroless Cu plating module 16. An electroless Cu plating layer 24 as a seed film is formed on the plating-layer laminate 23 of the substrate 2 (FIG. 2(d)) by a known electroless plating technique.

Then, the substrate 2 is delivered by the transport arm 11b to the electrolytic Cu plating module 17. The substrate 2 is subjected to an electrolytic Cu plating process, so that the recess 2a of the substrate 2 is filled with an electrolytic Cu plating layer 25, with the electroless Cu plating layer 24 serving as the seed film (FIG. 2(e)).

Thereafter, the substrate 2 is returned by the transport arm 11b to the substrate buffer 11c, and is then returned by the transport arm 11a to the cassette. After that, the substrate 2 is unloaded from the plating system 10, and a rear side of the substrate 2 (side opposite to the recess 2a) is chemically and mechanically ground by a grinding apparatus (FIG. 2(f)).

The control unit 19 executes a recipe execution program installed in the storage medium 19A, so that the control unit 19 controls devices/units provided in the plating system 10 based on recipes stored in the storage medium 19A so as to perform the series of substrate transport operations and the various processes to the substrate 2 mentioned above.

Figure 7:
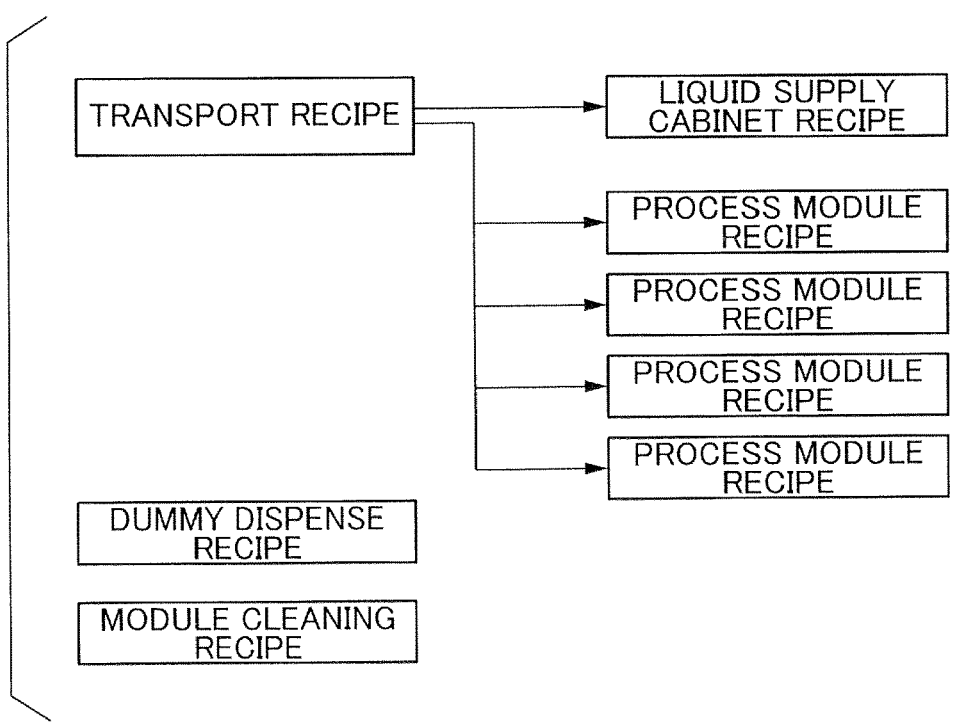
FIG. 7 is a block diagram for explaining the structure of a recipe.

The recipes are explained with reference to FIG. 7. The recipes may include a "transport recipe", a "liquid supply cabinet recipe", a "process module recipe", a "dummy dispense recipe", a "module cleaning recipe" and so on, for example. Depending on the type of the substrate processing apparatus, additional recipe may be added, or some of the above recipes may be deleted.

The "transport recipe" is a recipe that specifies a transport destination of a substrate which is to be transported by the substrate transport mechanism 11 (e.g., the transport arm 11b thereof). Roughly speaking, the transport recipe specifies operations (recipe steps) performed to each substrate 2, such as "remove the substrate from the substrate buffer 11c, and load the substrate 2 to the coupling module 12", "after completion of the process, remove the substrate 2 from the coupling module 12, and load that substrate to the catalyst-layer forming module 13" and so on.

The "liquid supply cabinet recipe" specifies operations of a specific part (e.g., tank 902) of the cleaning-liquid supply mechanism 90 for supplying a cleaning liquid to the substrate 2 and the plating-liquid supply mechanism 30 for supplying plating liquid to the substrate 2. The specific part is a part which is not related individually to the respective plating modules 14 and 16 but is shared by all the plating modules 14 and 16. In detail, the specific part is a part, on the upstream side of the branch lines 912, of the configuration shown in FIG. 4. The specific part is referred to as "liquid supply cabinet" hereinafter. The operations related to the "liquid supply cabinet recipe" may include, for example, automatic operations for discharging the liquid in the tank 902 through the drain unit 918, for replenishing a new liquid into the tank 902 from the tank-liquid replenishing unit 916 and so on, which are performed when decrease of the amount of the liquid in the tank 902, decrease of the concentration of the liquid in the tank 902, increase of the amount of the contamination in the liquid in the tank 902 or the like is detected.

The "process module recipe" specifies operations of the processing modules. For example, the process module recipe specifies upward and downward movements of the substrate rotating and holding mechanism 110 and the cup 105, operations of the liquid supply mechanisms 30 and 90 (specifically, not-shown on/off valves positioned directly on the upstream side of the ejection nozzles 32 and 92, flow-rate control valves and so on), operations of the liquid discharge mechanisms 120, 125 and 130, operations of not-shown temperature control mechanisms, and so on, in the electroless plating modules 14 and 16. The process module recipe also specifies the temperature of the hot plate 15A in the baking module 15, and operations of a supply mechanism and a discharge mechanism that supplies and discharges $N_2$ gas to and from the sealed casing 15*a*.

In this embodiment, the liquid supply cabinet recipe and the process module recipe belong to the transport recipe. Upon creation of the below-described maintenance macro, the liquid supply cabinet recipe and the process module recipe can be called up and selected through the transport recipe. Since the transport of the substrate 2, the processes carried out in the respective processing modules (modules 12 to 17, etc.), and the operations of the liquid supply cabinet of the liquid supply mechanism 30 and 90 are closely related to one another in terms of function and time, the liquid supply cabinet recipe and the process module recipe belong to the transport recipe, in this embodiment.

For example, if there is a step of the transport recipe in which "(1) the transport arm 11*b* holding the substrate 2 goes into the electroless plating module 14", there is a step of the process module recipe in which "(2) the substrate rotating and holding mechanism 110 of the electroless plating module 14 receives the substrate 2 held by the transport arm 11*b*" in relation to the step (1). After completion of the step (2) of the process module recipe, various steps of the process module recipe are performed in the electroless plating module 14. Namely, the step (2) of the process module recipe and various steps succeeding thereto are specified dependently on the step (1) of the transport recipe.

The "dummy dispense recipe" specifies dummy dispensing of processing liquids from the ejection nozzles 32 and 92 (ejection of the processing liquids from the ejection nozzles 32 and 92 when no substrate is being processed). For example, in a case where a processing liquid whose temperature is controlled (heated processing liquid) is ejected to a substrate, the processing liquid having a stable temperature can be supplied to a product substrate from the very first, by allowing in advance a heated processing liquid to flow through the ejection nozzle (32 or 92) and the liquid supply line connected thereto so as to warm up the ejection nozzle and the liquid supply line (such an ejection of processing liquid, which is not directly related to a process for product substrates, is referred to as "dummy dispensing"), before the process for product wafers is started. Since it is convenient that such an operation can be carried out independently of the process module recipe, the dummy dispense recipe is independent of the transport recipe and the process module recipe.

The "module cleaning recipe" specifies operations as follows. For example, a processing module, which uses a highly contaminating processing liquid (which may cause cross contamination) or a processing liquid that is difficult to be removed, may have a cleaning nozzle for periodically cleaning a cup (e.g., cup 105). The module cleaning recipe is a recipe defining operations of such cleaning means. The module cleaning recipe is also independent of the transport recipe and the process module recipe.

Next, an explanation is made for operations for editing a group of shutdown operation commands (recipe steps) and a group of startup operation commands (recipe steps) as a single macro (maintenance macro), in the aforementioned plating system 10. The macro thus edited is stored in the storage medium 19A of the control unit 19. The shutdown operation commands are commands for automatically transferring the plating system 10 from a normally-operating condition to a condition suitable for the man power maintenance. The startup operation commands are commands for automatically transferring the plating system 10 to a condition suitable for the normal operation after completion of the man power maintenance.

Figure 8:
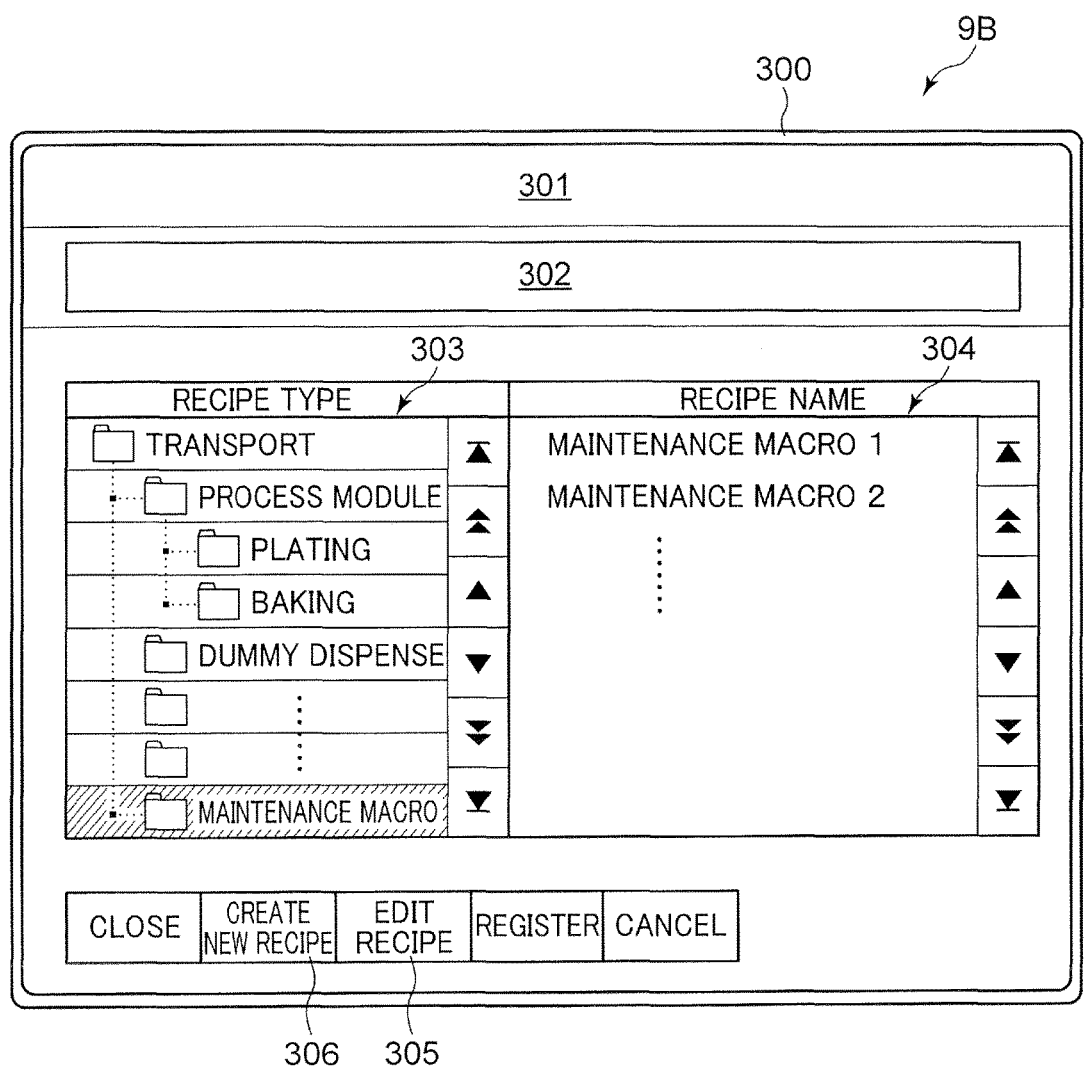
FIGS. 8 to 12 are charts for explaining an edit screen.

Firstly, by selecting a "DISPLAY RECIPE LIST SCREEN" command from a menu bar (not shown) in a main screen (the menu bar is present in a region corresponding to menu/tool bar areas 301 and 302 located in an upper part of FIG. 8), a recipe list screen 300 is displayed as shown in FIG. 8, for example. A left area 303 of the recipe list screen 300 displays a list of folders, in which the recipes are sorted by the type (i.e., the above-described transport recipes, the process module recipes, the dummy dispense recipes and so on). Since the "maintenance macro" is a group of operation commands (recipe steps), the maintenance macro is, of course, one type of "recipe".

Upon touching a certain folder to be selected on this screen, a list of recipes of the type corresponding to the selected folder are displayed on a right area 304 of the recipe list screen 300.

Since a "maintenance macro" is to be edited from now, the folder of the "maintenance macro" is touched. Then, as displayed on the right area 304 of FIG. 8, recipe names (titles of maintenance macros) such as "MAINTENANCE MACRO 1", "MAINTENANCE MACRO 2" and so on are displayed.

Figure 9:
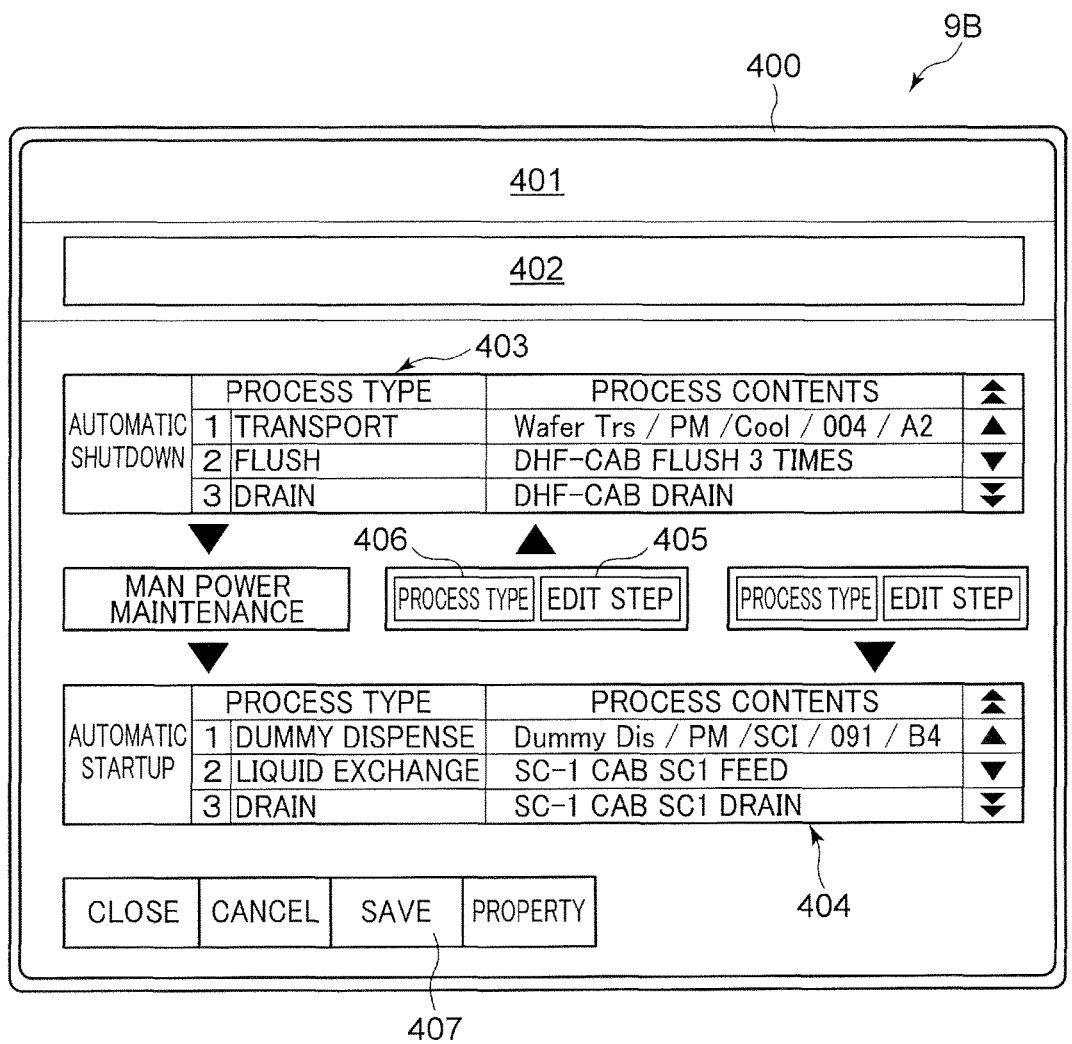

Upon selecting "MAINTENANCE MACRO 1" by touching it for example and then touching an imaginary button 305 of "EDIT RECIPE" located in a lower part of the screen, a recipe edit screen of FIG. 9 is displayed, which is described later, whereby the recipe which has been already created and registered can be edited.

Herein, a new maintenance macro is to be created. In this case, an imaginary button 306 of "CREATE NEW RECIPE" is touched. Then, the recipe edit screen 400 shown in FIG. 9 is displayed.

The recipe edit screen 400 includes a display area 403 related to automatic shutdown, and a display area 404 related to automatic startup. The reference numerals 401 and 402 indicate areas on which a menu, a tool bar, data and so on are displayed. The area 402 displays the title of the maintenance macro (if it has been already decided), which is now displayed on the screen.

The display area 403 related to the automatic shutdown recites a group of shutdown operation commands (recipe steps), by which the plating system 10 is partly or entirely shut down from a normally operating condition of the plating system 10 to automatically place the plating system 10 in a condition suitable for man power maintenance.

The display area 404 related to the automatic startup recites a group of startup operation commands (recipe steps) for placing the plating system 10 in a condition for the normal operation after completion of the man power maintenance.

The method of editing the display area 403 is described below.

Suppose that nothing is recited now in the display area 403. Under this condition, upon touching the uppermost part of the display area 403 (area reciting "1 Transport WaferTrs/ PM/Cool /004/A2" in FIG. 9) to select this area and further touching an imaginary button 405 of "EDIT STEP" corresponding to the display area 403, an indication prompting input of a recipe step, which is to be performed as a first step of the series of automatic startup steps, is displayed on the screen. Namely, for example, only the left end letter "1" is displayed in the area reciting "1 Transport Wafer Trs/PM/

Cool/004/A2" in FIG. 9, and this area is highlighted by changing the brightness or the color of this area.

Figure 10:
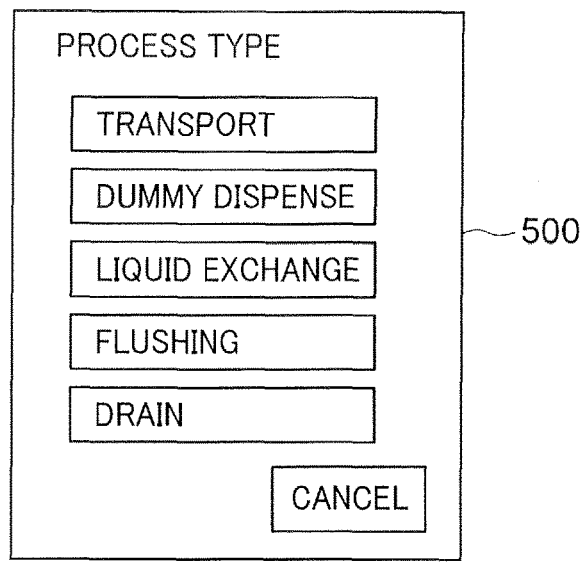

Then, under this condition, upon touching an imaginary button 406 of "PROCESS TYPE", a small screen 500 as shown in FIG. 10 appears. The operation commands constituting the maintenance macro are to be selected from a process list prepared beforehand, and can be selected through the screen shown in FIG. 10.

Suppose that an operation to be firstly performed for shutdown is "cool a processing module whose internal temperature is relatively high temperature during the normal operation to a temperature that does not interfere with man power maintenance". In this case, the temperature of the processing module is managed by the process module recipe, and the process module recipe is dependent on the transport recipe. Thus, "TRANSPORT" on the screen of FIG. 10 is touched.

Then, a list of individual operation commands of the transport recipe (transport recipe steps) and individual operation commands of the process module recipe (processing recipe steps) depending on the transport recipe are displayed on another screen, which is not shown herein. After the list has been displayed, a required operation command is touched to select this operation command. For example, for the baking module 15, one or more rows displaying operation commands corresponding to the cooling of the baking module may be touched. The operations corresponding to the cooling of the baking module include "turning off the power source of the hot plate 15A" and "opening the gas supply opening 5c and the gas exhaust opening 15b to flow cooing air", for example.

By selecting the operation command and by touching a not-shown "DECISION" button displayed on a not-shown screen displaying the aforementioned list of operation commands of the transport recipe and the process module recipe, the selection is settled, so that the display becomes to display the indication "1 Transport WaferTrs/PM/Cool/004/A2" as shown in FIG. 9. "WaferTrs/PM/Cool/004/A2" is a name or recipe step corresponding to the cooling of the baking module. A "CANCEL" button (not shown) is displayed on the aforementioned not-shown screen. When the selection is desired to be cancelled, the button is touched.

Suppose that the next operation for shutdown is "performing flushing in order to clean the tank and pipe of the liquid supply cabinet for filter replacement and sensor cleaning". The term "flushing" means an operation that fills a storage unit and/or a pipe (e.g., the tank 902 and the circulation line 904 in FIG. 2), through which a liquid circulates, with a clean liquid (by using, e.g., the tank liquid replenishing unit 916), and allows the liquid to flow through the storage unit and/or the pipe, and discharges the liquid (by using, e.g., the drain unit 918), so as to clean the storage unit and/or the pipe.

Under this condition, by touching a blank row immediately below the display area 403 (area displaying "1 Transport WaferTrs/PM/Cool/004/A2") to select this area, and by further touching the imaginary button 405 of "edit step" corresponding to the display area 403, a display promoting input of a recipe step, which is performed as a second step of the series of automatic startup steps, is shown. Namely, for example, only the letter "2" is displayed in an area reciting "2 DHF-CAB FLUSH 3 TIMES" in FIG. 9, and this area is highlighted by changing the brightness or the color of this area.

Under this condition, by touching the imaginary button 406 of "PROCESS TYPE", the small screen 500 shown in FIG. 10 appears. In this example, a button of "FLUSHING" in FIG. 10 is touched.

Figure 11:
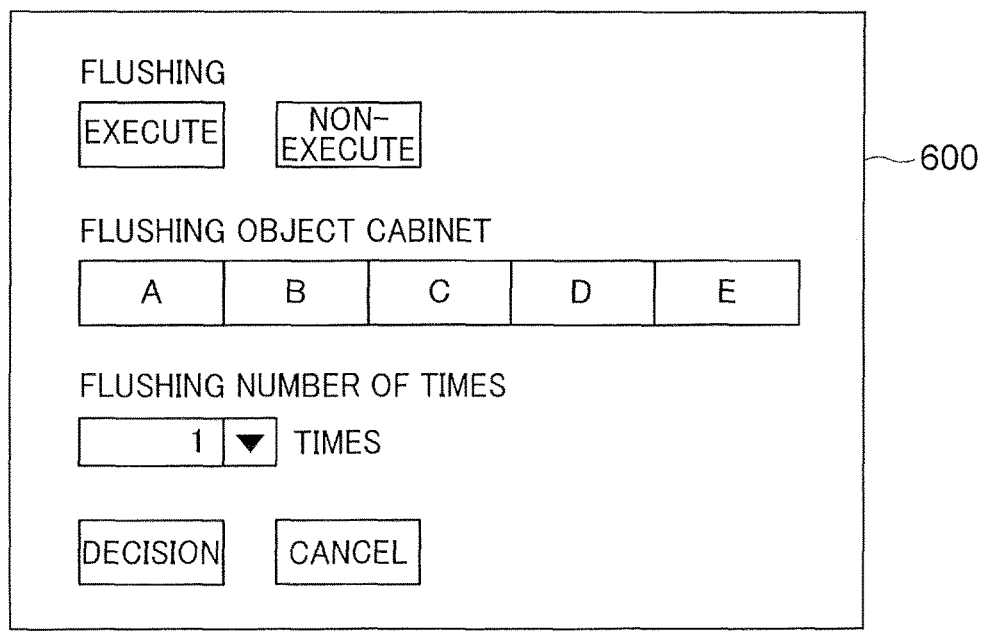

Then, a small screen as shown in FIG. 11 appears. The operator touches an imaginary button "EXECUTE" or "NON-EXECUTE" to determine whether or not the flushing is to be executed. When the flushing is to be executed, the operator touches the imaginary button(s) to select flushing object cabinet(s) (i.e., liquid supply cabinets to be flushed). Herein, desired one(s) is selected from the cabinets A to E. Then, the number of times of flushing is selected.

After the above selection has been finished, by touching an imaginary button of "DECISION" in the small screen 600, the selection is settled. Then, the second row of the display area 403 in FIG. 9 displays "2 FLUSHING DHF-CAB FLUSH 3 TIMES". This means, for example, the DHF-liquid supply cabinet is subjected to the flushing operation three times.

Suppose that the next operation to be performed for shutdown is "draining the liquid from the same liquid supply cabinet". In this case, edition of the third row of the display area 403 in FIG. 9 is performed similarly to the above. When "DRAIN" is selected from the small screen 500 in FIG. 10, a small screen similar to that shown FIG. 11 is displayed. The screen displays imaginary buttons "EXECUTE" and "NON-EXECUTE" for selecting whether or not the draining should be executed, and imaginary buttons for selecting the liquid supply cabinet to be drained, and imaginary buttons "DECISION" and "CANCEL".

Similarly to the above, all the recipe steps (operation commands) necessary for shutdown are registered.

After the registration of the recipe steps required for the automatic shutdown, recipe steps required for the automatic startup are then edited and registered. A editing and registering procedure is the same as the aforementioned procedure for the recipe steps required for shutdown. However, different imaginary buttons of "EDIT STEP" and "PROCESS TYPE" (the imaginary buttons on the right side of FIG. 9) are used.

The process type that can be selected on the small screen 500 in FIG. 10 is briefly described. When "DUMMY DISPENSE" is selected on the screen in FIG. 10, a new screen displaying a list of recipe steps of the dummy dispense recipe appears. The recipe step list describes dummy dispensing steps that can be performed. One example of the dummy dispensing step is as follows: ejecting processing liquid C from ejection nozzle B of processing module A for D seconds". An appropriate one is selected from this list, and "ENTER" on the screen is touched, whereby a recipe step name such as "DummyDis/PM/SC1/091/B4" is displayed on the display area 404 for displaying the recipe steps for startup shown in FIG. 9.

When "LIQUID EXCHANGE" is selected on the screen in FIG. 10, there are displayed imaginary buttons "execute" and "non-execute" for selecting whether or not the liquid exchanging is to be performed, imaginary buttons for selecting the liquid supply cabinet whose liquid is to be exchanged, and imaginary buttons "DECISION" and "CANCEL".

After completion of the registration of the recipe steps required for the automatic startup, by touching an imaginary button 407 of "SAVE" displayed on a lower part of FIG. 9, the new maintenance macro including the group of the recipe steps shown in FIG. 9 is registered. In this embodiment, the name is the new maintenance macro is automatically given upon registration. If "MAINTENANCE MACRO 1" and "MAINTENANCE MACRO 2" have been already registered as the names of the maintenance macros, the new maintenance macro is registered with the name "MAINTENANCE MACRO 3". Alternatively, the maintenance macro to be registered may be named by using a not-shown imaginary keyboard that can be displayed on the edit screen, instead of the automatic naming.

Next, the automatic shutdown, the man power maintenance and the automatic startup performed with the use of the saved maintenance macro are explained.

By touching an imaginary button of an "OPERATION LIST" (not shown) in the menu bar (not shown) in the main screen, the operation list is expanded and displayed. The operation list includes an item "execute maintenance recipe" in addition to items such as "execute process recipe for processing product substrates", "forward or receive process recipe" and so on. By touching the display of "execute maintenance recipe", the operation list is switched to a maintenance recipe execution screen 700 as shown in FIG. 12.

Figure 12:
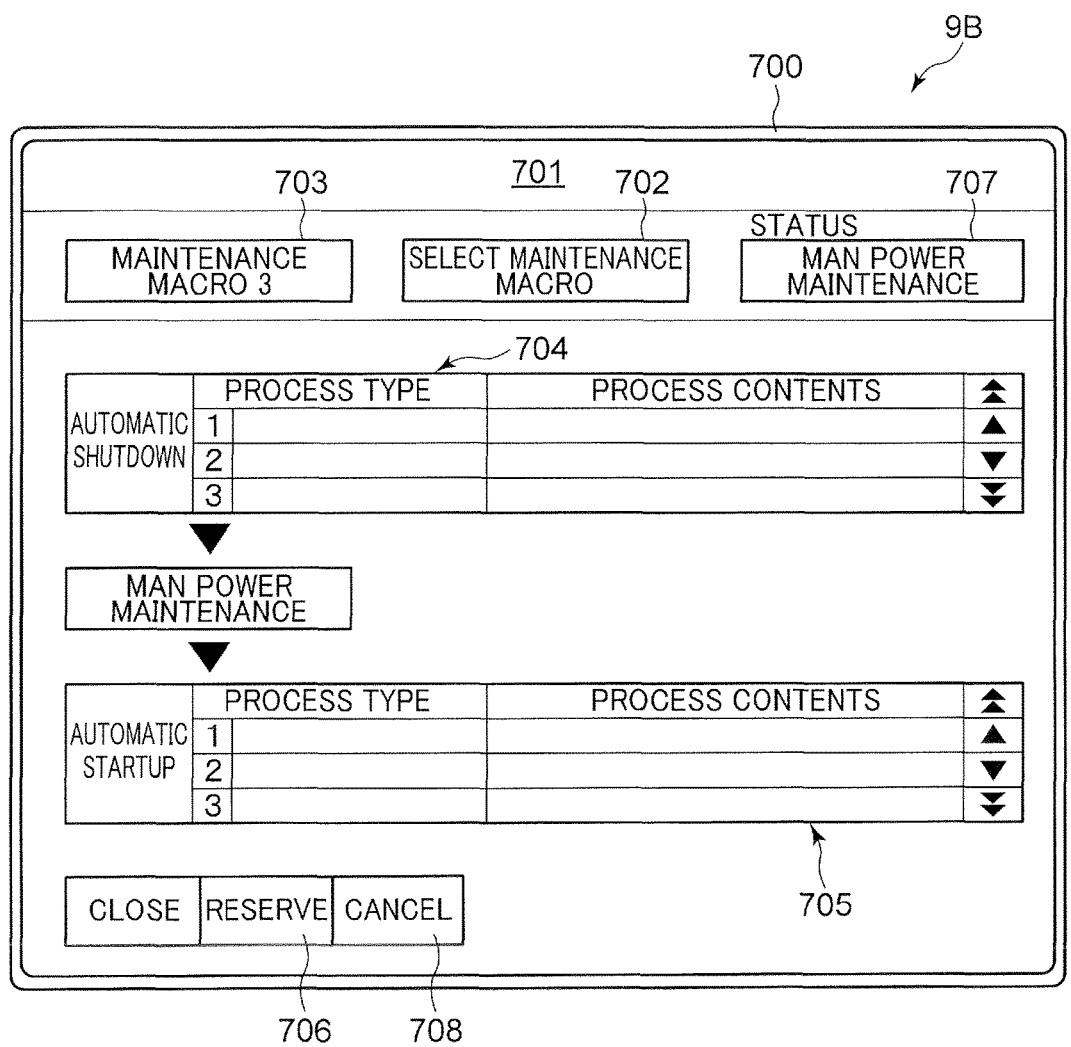

On the screen shown in FIG. 12, by touching an imaginary button 702 of "SELECT MAINTENANCE MACRO", another small screen (not shown) showing a list of registered maintenance macros is opened. An appropriate maintenance macro is selected on this screen and an imaginary button of "ENTER" is touched, so that the selected maintenance macro, herein the "MAINTENANCE MACRO 3" is displayed on an area 703, and the recipe steps for shutdown and the recipe steps for startup are displayed on areas 704 and 705 on the screen, in substantially the same form as that shown in FIG. 9. For example, the matters described in the areas 403 and 404 of the screen 400 in FIG. 9 and the matters described in the areas 704 and 705 of the screen 700 in FIG. 12 are the same with each other. When there is no mistake in the selected maintenance macro, an imaginary button 706 of "RESERVE" is touched.

If the plating system is now in the normally-operating condition, the execution of the maintenance macro is put on standby until the scheduled processing of all the substrates is completed. Upon completion of the scheduled processing of all the substrates, the execution of the maintenance macro is started.

The recipe steps for shutdown are automatically performed in the registered order. After all the recipe steps for shutdown have been completed, the plating system becomes ready for starting the man power maintenance. An operator or a worker presses down a not-shown start button provided in the plating system, and then starts the man power maintenance. After the man power maintenance has been completed and the worker has evacuated from the plating system, the worker presses down a not-shown finish button provided in the plating system. Then, the recipe steps for startup are automatically performed in the registered order. The area 707 displays the step performed at present, i.e., one of the automatic shutdown, the man power maintenance and the automatic startup is displayed. In addition, the row corresponding to the numbered step now performed is highlighted, whereby which step is now performed at present can be understood. The automatic shutdown and the automatic startup can be canceled or stopped by touching an imaginary button 708 of "CANCEL".

Upon completion of all the recipe steps for startup, the plating system 1 immediately becomes ready for the normal operation, i.e., processing of product substrates. However, prior to starting the processing of the product substrates, processing of a monitor substrate and confirmation of its processing result may be performed so as to confirm whether or not the plating system is in a proper condition.

In the foregoing embodiment, the control unit 19 of the plating system 10 has a function of storing, as a single macro, a group of operation commands for shutdown by which the plating system 10 is automatically transferred from a normally-operating condition to a condition suitable for man power maintenance, and a group of operation commands for startup by which the plating system 10 is automatically transferred to a condition suitable for the normal operation after completion of the man power maintenance. Further, the group of the operation commands for shutdown and the group of the operation commands for startup are both displayed on a single edit screen of the display 19b, and the single macro can be edited on the single edit screen through the input unit 19c. Moreover, both of the macro-constituting operation commands for shutdown and startup that are now being edited and the macro-constituting operation commands for shutdown and startup that have been edited can be seen on the single edit screen of the display 19b.

Thus, an operator can edit a maintenance macro, while grasping in a correlated manner the shutdown of the system before the man power maintenance of the plating system 10 and the startup of the system after the man power maintenance. Thus, it is possible to prevent excess or deficiency or error of recipe steps to be included in the maintenance macro, whereby reliable and efficient maintenance can be achieved.

In the foregoing description of the embodiment, the explanation has been made for a case where a maintenance macro is edited in connection with the maintenance of the plating system 10. However, not limited thereto, the substrate processing apparatus may be of another type. For example, the substrate processing apparatus may include only a plurality of chemical-liquid cleaning modules as processing modules. Alternatively, for example, the substrate processing apparatus may be a coating and developing apparatus that forms a film for photolithography. In this case, the apparatus includes, as processing modules, resist coating modules, antireflection-film forming modules, developing modules, cleaning modules, a baking modules and so on. Further, the substrate processing apparatus may be an apparatus configured to perform a CVD (chemical vapor deposition) process and/or an etching process by thermal reaction with a processing gas being introduced into a reaction chamber.

The contents of recipe steps to be included in a maintenance macro may be changed depending on the structure of processing modules in the substrate processing apparatus, the type of process to be performed by the processing modules and so on. For example, in a case of a baking (heating) module, it is sufficient for the shutdown of the module to lower the temperature. Thus, the recipe steps to be performed to the module for shutdown may include only one recipe step for "lowering the temperature of the module". Namely, it is not always necessary that a plurality of operation commands for shutdown or a plurality of operation commands for startup are included in a maintenance macro. Depending on cases, the provision of at least one recipe step for each of shutdown and startup may be sufficient. For example, only the transport recipe may be used. On the other hand, in a case of a processing module that perform a chemical liquid treatment process under a relatively high temperature, a lot of recipe steps may be performed to the module for shutdown, e.g., a step of lowering a temperature of the module, a step of cleaning the module, a step of flushing a related liquid supply cabinet and a step of draining the same.

In the foregoing description of the embodiment, the explanation has been made for the case in which the control unit 19 of the substrate processing apparatus edits a maintenance macro by using the display and the input unit related to the control unit 19. However, specialized software may be installed in a multipurpose information processing apparatus, such as an external personal computer (PC), with the use of a storage medium or the like, such that the information processing apparatus realizes the same functions as those described in connection with the foregoing embodiment. In this case, the PC serves as the edition unit, the display connected to the PC serves as the display unit, and a mouse and a keyboard serve as the input unit. Upon execution of the software by the PC, a display unit that displays operation commands for shutdown and startup on a single edit screen, an edition unit that enables editing of a single macro including the operation commands both for shutdown and startup on the single edit screen, and a transmission unit that transmits the single macro having been edited by the edition unit to the substrate processing apparatus, are realized. The PC just creates (edits) a macro, while the created macro is transmitted to the substrate processing apparatus through a network or the like. When the macro is executed in the substrate processing apparatus, the same operations as those executed in the substrate processing apparatus described in connection with the foregoing embodiment are carried out.

What is claimed is:

1. A substrate processing apparatus comprising:
   a substrate processing unit processing a substrate, the substrate processing unit being configured to process the substrate while at least one of heating the substrate or supplying a processing liquid with the substrate,
   a control unit having a non-transitory storage medium that stores operation commands as a single macro, the commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, wherein the control unit controls the substrate processing apparatus according to the macro;
   an input unit that allows inputting of the operation commands into the control unit; and
   a display unit that displays information related to the operation commands inputted into the control unit;
   wherein the control unit makes the display unit display both the operation command for shutdown and the operation command for startup together on a single edit screen of the display unit and allows editing of the macro on the single edit screen by using the input unit,
   wherein on an edit screen, execution of a group of the operation commands for shutdown and an order of execution of a group of the operation commands for startup can be set in the respective display areas of the single edit screen, and
   wherein a single execution screen is displayed on the display unit to execute the macro, and the group of the operation commands for shutdown and the group of the operation commands for startup are both respectively displayed in different display areas on the single execution screen.

2. The substrate processing apparatus according to claim 1, wherein at least one of the operation commands for shutdown and the operation command for startup that are included in the macro is selected from operation commands corresponding to a recipe step included in the transport recipe that is used in the normally-operating condition and operation commands included in a recipe dependent on the transport recipe.

3. The substrate processing apparatus according to claim 1, wherein an area in the single execution screen corresponding to the operation command that is being executed at present is highlighted.

4. The substrate processing apparatus according to claim 1, further comprising a baking module controlled by the control unit to heat the substrate to be processed in the substrate processing apparatus, wherein the operation command for shutdown of the substrate processing apparatus comprises an operation command for cooling of the baking module.

5. The substrate processing apparatus according to claim 1, further comprising a liquid supply cabinet controlled by the control unit to supply the processing liquid for processing a substrate, wherein the operation command for shutdown of the substrate processing apparatus comprises an operation command for draining the processing liquid from the liquid supply cabinet.

6. The substrate processing apparatus according to claim 1, wherein the control unit makes the edit screen display separately an imaginary button for displaying a list of commands selectable as the operation command for shutdown, and an imaginary button for displaying a list of commands selectable as the operation command for startup.

7. The substrate processing apparatus according to claim 1, wherein on the edit screen, a display area is located between the area displaying the operation command for shutdown and the area displaying the operation command for startup, the display area showing that there is manpower maintenance which is previously set such that start and finish commands are input by an operator or a worker.

8. A non-transitory storage medium storing a program executable by a computer serving as a control unit of a substrate processing apparatus,
   wherein the substrate processing apparatus includes:
   a substrate processing unit processing a substrate, the process processing unit being configured to process the substrate while at least one of heating the substrate or supplying a processing liquid with the substrate;
   the control unit having a non-transitory storage medium that stores operation commands as a single macro, the operation commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, wherein the control unit controls the substrate processing apparatus according to the macro;
   an input unit that allows inputting of the operation commands into the control unit; and a display unit that displays information related to the operation commands inputted into the control unit, wherein the storage medium stores a program, upon execution of which a function of editing and displaying a maintenance recipe is realized via the computer, wherein the function includes a function to make the display unit display respectively the operation command for shutdown and the operation command for startup in different display areas on a single edit screen of the display unit, and to allow editing of the macro in the respective display areas on the single edit screen by using the input unit, wherein a control unit allows editing of the macro related to an order of execution of a group of the operation commands for shutdown and an order of execution of a group of the operation commands for startup by using the input unit on the single edit screen, and wherein the control unit makes the display unit display a single execution screen in order to execute the macro, and the group of the operation commands for shutdown and the group of the operation commands for startup are both displayed in the respective display areas on the single execution screen.

9. The non-transitory storage medium according to claim 8, wherein the substrate processing apparatus further includes a baking module controlled by the control unit to heat the substrate to be processed in the substrate processing apparatus, and wherein the operation command for shutdown of the substrate processing apparatus comprises an operation command for cooling of the baking module.

10. The non-transitory storage medium according to claim 8, wherein the substrate processing apparatus further includes a liquid supply cabinet controlled by the control unit to supply the processing liquid for processing the substrate, wherein the operation command for shutdown of the substrate processing apparatus comprises an operation command for draining the processing liquid from the liquid supply cabinet.

11. An editing apparatus for editing operation commands for use in a substrate processing apparatus having a non-transitory storage medium that stores operation commands as a single macro, the operation commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, the editing apparatus comprising:

a substrate processing unit processing a substrate, the substrate processing unit being configured to process the substrate while at least one of heating the substrate or supplying a processing liquid with the substrate;

a display unit that displays both the operation command for shutdown and the operation command for startup respectively in different display areas on a single edit screen of the display unit;

an editing unit that allows the single macro including both the operation command for shutdown and the operation command for startup to be edited in the respective display areas on the single screen in accordance with inputs by the input unit; and a transmission unit that transmits the single macro having been edited by the editing unit to the substrate processing apparatus.

12. The editing apparatus according to claim 11, wherein the substrate processing apparatus further includes a baking module controlled by the control unit to heat the substrate to be processed in the substrate processing apparatus, and wherein the operation command for shutdown of the substrate processing apparatus comprises an operation command for cooling of the baking module.

13. The editing apparatus according to claim 11, wherein the substrate processing apparatus further includes a liquid supply cabinet controlled by the control unit to supply a processing liquid for processing the substrate, wherein the operation command for shutdown of the substrate processing apparatus comprises an operation command for draining the processing liquid from the liquid supply cabinet.

14. The editing apparatus according to claim 11, wherein the operation command for shutdown and the operation command for startup that are included in the macro are selected from operation commands corresponding to a recipe step included in a transport recipe that is used in the normally-operating condition and operation commands included in a recipe dependent on the transport recipe.

15. The editing apparatus according to claim 11, wherein, on the edit screen, order of execution of a group of operation commands for shutdown and order of execution of a group of operation commands for startup can be set in the respective display areas.

16. The editing apparatus according to claim 11, wherein a single execution screen is displayed on the display unit in order to execute the macro, and a group of operation commands for shutdown and a group of operation commands for startup are both respectively displayed in the different display areas on the single screen.

17. The editing apparatus according to claim 11, wherein an execution screen includes an area corresponding to an operation command, the area configured to be highlighted when the operation command is executed.

18. The editing apparatus according to claim 11, wherein the editing apparatus makes the edit screen display separately an imaginary button for displaying a list of commands selectable as the operation command for shutdown, and an imaginary button for displaying a list of commands selectable as the operation command for startup.

19. The editing apparatus according to claim 11, wherein on the edit screen, a display area is located between the area displaying the operation command for shutdown and the area displaying the operation command for startup, the display area showing that there is man power maintenance which is previously set such that start and finish commands are inputted by an operator or a worker.

20. An editing method of editing operation commands for use in a substrate processing apparatus having a non-transitory storage medium that stores operation commands as a single macro, the substrate processing apparatus comprising: a substrate processing unit processing a substrate, the substrate processing unit being configured to process the substrate while at least one of heating the substrate or supplying a processing liquid with the substrate, the commands including an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, the editing method comprising:

displaying respectively both the operation command for shutdown and the operation command for startup in different display areas on a single edit screen;

allowing the single macro including both the operation command for shutdown and the operation command for startup to be edited in the respective display areas on the single edit screen in accordance with an input by the input unit; and transmitting the single macro having been edited by the editing unit to the substrate processing apparatus;

wherein a control unit allows editing of the macro related to an order of execution of a group of the operation commands for shutdown and an order of execution of a group of the operation commands for startup by using the input unit on the single edit screen by using the input unit, and wherein the control unit makes the display unit to display a single execution screen in order to execute the macro, and the group of the operation commands for shutdown and the group of the operation commands for startup are both displayed together on the single execution screen.

21. The editing method according to claim 20, wherein the substrate processing apparatus further includes a baking module controlled by the control unit to heat the substrate to be processed in the substrate processing apparatus, and wherein the operation command for shutdown of the substrate processing apparatus comprises an operation command for cooling of the baking module.

22. The editing method according to claim 20, wherein the substrate processing apparatus further includes a liquid supply cabinet controlled by the control unit to supply the processing liquid for processing the substrate, wherein the operation command for shutdown of the substrate processing apparatus comprises an operation command for draining the processing liquid from the liquid supply cabinet.

23. A non-transitory storage medium storing a program for performing an editing method for editing an operation command for use in a substrate processing apparatus having a function for storing operation commands as a single macro, the operation commands including a command for processing a substrate in a substrate processing unit, the substrate processing unit being configured to process the substrate while at least one of heating the substrate or supplying a processing liquid with the substrate, an operation command for shutdown of the substrate processing apparatus by which the substrate processing apparatus is automatically transferred from a normally-operating condition to a condition suitable for man power maintenance, and an operation command for startup of the substrate processing apparatus by which the substrate processing apparatus is automatically transferred to a condition suitable for normal operation after completion of the man power maintenance, the editing method comprising:

displaying respectively both the operation command for shutdown and the operation command for startup together in different display areas on a single edit screen;

allowing the single macro including both the operation command for shutdown and the operation command for startup to be edited in the different display areas on the single edit screen in accordance with an input by the input unit; and transmitting the single macro having been edited by the editing unit to the substrate processing apparatus.

24. The non-transitory storage medium according to claim 23, wherein the substrate processing apparatus further includes a baking module controlled by the control unit to heat the substrate to be processed in the substrate processing apparatus, and wherein the operation command for shutdown of the substrate processing apparatus comprises an operation command for cooling of the baking module.

25. The non-transitory storage medium according to claim 23, wherein the substrate processing apparatus further includes a liquid supply cabinet controlled by the control unit to supply the processing liquid for processing the substrate, wherein the operation command for shutdown of the substrate processing apparatus comprises an operation command for draining the processing liquid from the liquid supply cabinet.

* * * * *